United States Patent [19]
Kugo

[11] Patent Number: 5,507,087
[45] Date of Patent: Apr. 16, 1996

[54] COVER SHEET ASSEMBLING APPARATUS FOR ELECTRONIC COMPONENT

[75] Inventor: Daisaku Kugo, Nagaokakyo, Japan

[73] Assignee: Murata Manufacturing Co., Ltd., Japan

[21] Appl. No.: 216,791

[22] Filed: Mar. 23, 1994

[30] Foreign Application Priority Data

Mar. 24, 1993 [JP] Japan .................. 5-090812

[51] Int. Cl.⁶ .................. B23P 19/00
[52] U.S. Cl. .......... 29/564.2; 29/33 K; 29/335; 29/33 M; 29/729; 29/564.6; 29/787
[58] Field of Search ............. 29/33 K, 864.16, 29/25.35, 465, 46, 33 M, 33.52, 564.2, 729, 738, 759, 241, 433, 33 Q, 33 S, 564.7, 564.8, 787, 790; 439/876

[56] References Cited

U.S. PATENT DOCUMENTS 2,283,629  5/1942  Heftler .
3,973,313  8/1976  Hunter ................. 29/564.6

FOREIGN PATENT DOCUMENTS 0446489  9/1991  European Pat. Off. ........ 439/876
0001013  1/1993  WIPO ........................ 29/465

*Primary Examiner*—Steven C. Bishop
*Attorney, Agent, or Firm*—Ostrolenk, Faber, Gerb & Soffen

[57] ABSTRACT

A cover sheet assembling apparatus for an electronic component such as a ladder-type filter, which delivers a sheet member stepwisely by feed means, punches out a cover sheet from the sheet member with a punch and a die, and inserts the cover sheet in an opening of a case so that the lead portions of terminal plates pass through slits of the cover sheet. According to this apparatus, it becomes possible to automatically assemble the cover sheet in the case, thereby the working efficiency is highly improved.

13 Claims, 5 Drawing Sheets

COVER SHEET ASSEMBLING APPARATUS FOR ELECTRONIC COMPONENT

BACKGROUND OF THE INVENTION

The present invention relates to a cover sheet assembling apparatus for an electronic component, and more particularly, it relates to an apparatus for inserting a cover sheet into an opening of a cover.

FIGS. 1 and 2 show a conventional four-element ladder-type filter. This filter comprises two series ceramic resonators 2 and 3, two parallel ceramic resonators 4 and 5, an input terminal plate 6, a ground terminal plate 7, an output terminal plate 8, an internal connection terminal plate 9 and a plate spring 10, which are stored in a box-type case 1. FIG. 3 is a circuit diagram showing the electrical connection thereof.

The input terminal plate 6 is provided on its one major surface with a protruding portion 6a which is in pressure contact with a central portion of the series resonator 2. The ground terminal plate 7 is provided on its both major surfaces with protruding portions 7a and 7b which are in pressure contact with central portions of the two parallel resonators 4 and 5 respectively. The output terminal plate 8 is provided on its both major surfaces with protruding portions 8a and 8b which are in pressure contact with central portions of the parallel resonator 5 and series resonator 3 respectively. The internal connection terminal plate 9 has a portion 9a which is inserted between the series resonator 2 and parallel resonator 4, a portion 9b which is arranged next to an outer major surface of the series resonator 3, and a coupling portion 9c which connects these portions 9a and 9b. Since the plate spring 10 is interposed between the portion 9b and an inner side surface of the case 1, the terminals 6–9 and the resonators 2–5 are in pressure contact with each other to be electrically connected.

A cover sheet 11 is inserted in an opening of the case 1, and a cavity which is defined by the cover sheet 11 and the opening is filled up with filler 12 such as resin, thereby the opening of the case 1 is sealed. Lead portions 6b, 7c and 8c of the input terminal 6, the ground terminal 7 and the output terminal 8 protrude from the opening of the case 1 so as to pass through the cover sheet 11.

When the ladder-type filter having the aforementioned structure is assembled in the conventional way, the cover sheet 11 is picked up by a forceps and manually inserted in the opening of the case 1. In particular, since the cover sheet 11 is previously provided with a plurality of slits for receiving the lead portions 6b, 7c and 8c of the terminals 6 to 8, it is necessary to scrupulously insert these lead portions in these slits so as to prevent the lead portions 6b, 7c and 8c from being bent. Thus, the conventional way for assembling the cover sheet 11 is required much time and much labor so that the assembling efficiency is lowered.

SUMMARY OF THE INVENTION

Accordingly, an object of the present invention is to provide a cover sheet assembling apparatus for an electronic component, which can automatically insert the cover sheet in a case with the lead portions of terminal plates passing therethrough in order to improve working efficiency.

The cover sheet assembling apparatus of the present invention is applied to an electronic component comprising a case having an opening, terminal plates and an element which are stored in the case. The terminal plates have lead portions protruding from the opening of the case. The apparatus comprises a die, holding means for holding the case, feed means for feeding a sheet member, and a punch. The die has a front major surface, a rear major surface and a die hole which passes through the die from the front major surface to the rear major surface and corresponds to the shape of the cover sheet. The case is held by the holding means at a side of the front major surface of the die so that the lead portions of the terminal plates are inserted into the die hole. The feed means feeds the sheet member, which is provided with slits for receiving the lead portions of the terminals, along the rear major surface of the die. The punch, which can be inserted in the die hole and in the opening of said case, punches out the cover sheet from the sheet member in association with the die hole.

First, the lead portions of the terminals protruding from the case are inserted in the die hole of the die. On the other hand, the feed means feeds the sheet member so as to locate the slits of the sheet member at prescribed positions with respect to the die hole. The sheet member can be easily positioned when the sheet member is in the form of a continuous tape. Then the punch is driven to punch out a cover sheet from the sheet member, so that the slits of the cover sheet are passed through by the lead portions. The punch may be provided with receiving grooves corresponding to the slits for receiving the lead portions of the terminal plates so as not to interfere with the lead portions. Then the punch is further driven so that the cover sheet is slid along the lead portions, to be inserted in the opening of the case.

If the slits of the cover sheet are misaligned with the lead portions, the lead portions may be easily bent by the cover sheet. In order to cope with this, it is preferable to provide a guide plate which is slidable along the front surface of the die. The guide plate has a smaller thickness than the lengths of the lead portions protruding from the case, and has guide grooves for supporting the lead portions. In this case, the lead portions of the terminals are correctly guided to the prescribed positions by the guide grooves when the case is set in the die, whereby the lead portions can be prevented from being bent. Further, when the guide plate is slid back so that the guide grooves release the lead portions after the cover sheet is punched out from the sheet member and forward ends of the lead portions are inserted in the slits, the guide plates will not interfere with the punch.

When the sheet member is made of a flexible material such as paper, it may be difficult to correctly punch out the sheet member into the shape of the cover sheet. Therefore, it is preferable to provide perforations in the sheet member corresponding to the contour of the cover sheet. In this case, the perforated portion of the sheet member can be easily cut out by the punch.

According to the present invention, as hereinabove described, the sheet member is fed by the feed means so that the cover sheet is punched out from the sheet member by the punch and the die, and the slits are passed through by the lead portions of the terminals when the cover sheet is inserted in the opening of the case. Thus, it is possible to automatically insert the cover sheet in the case such that the working efficiency is highly improved compared with the conventional method of manual insertion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
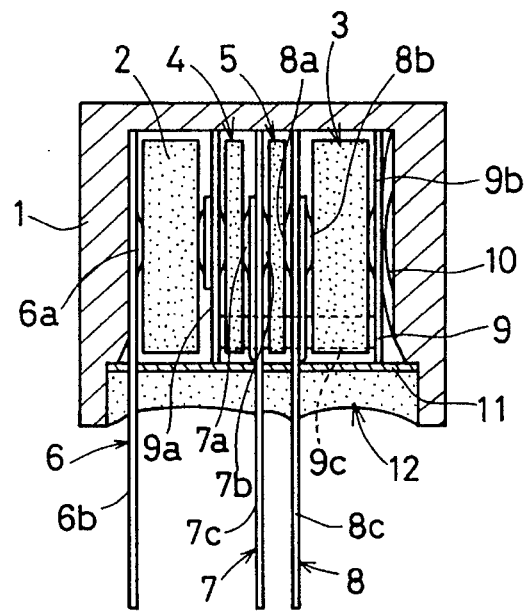
FIG. 1 is a sectional view showing a conventional four-element ladder-type filter.
Figure 2:
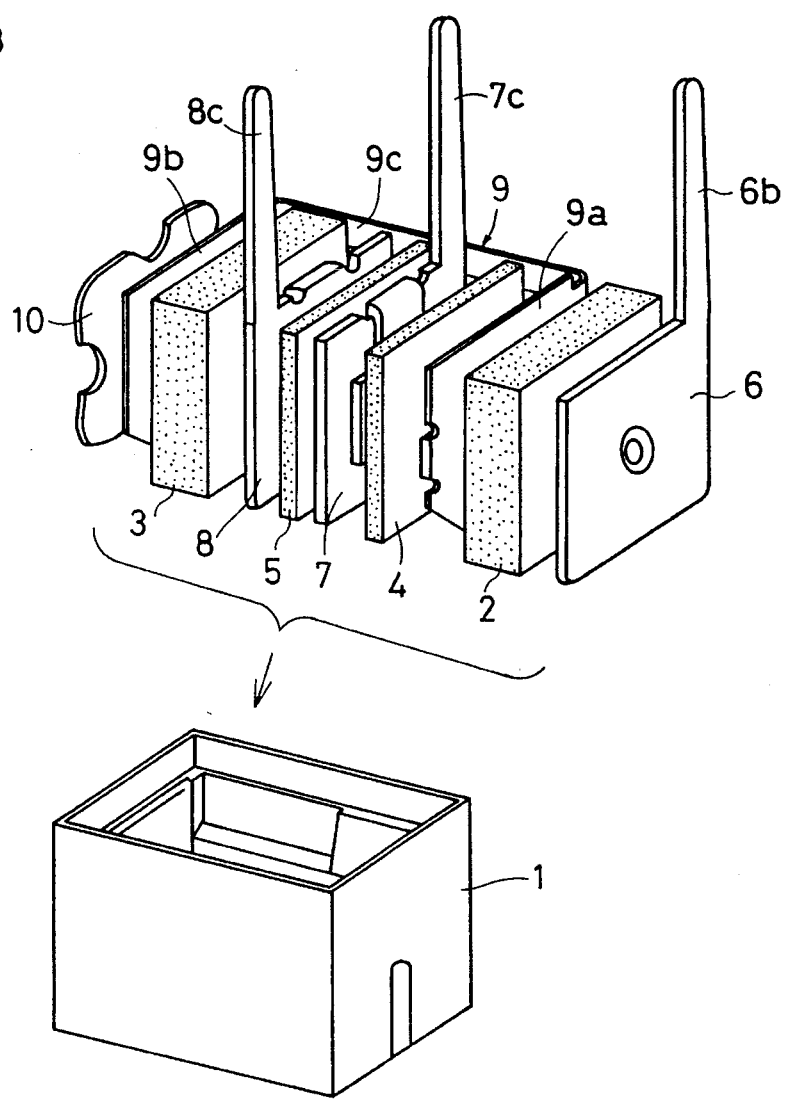
FIG. 2 is an exploded perspective view of the filter shown in FIG. 1.
Figure 3:
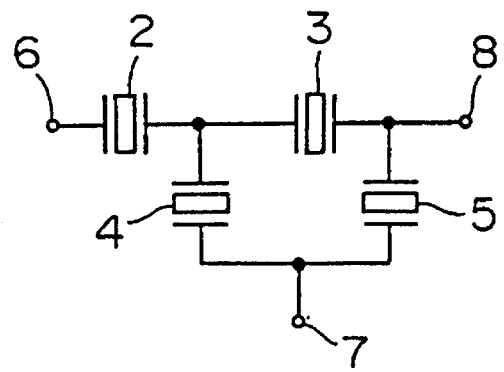
FIG. 3 is a circuit diagram of the filter shown in FIG. 1.
Figure 4:
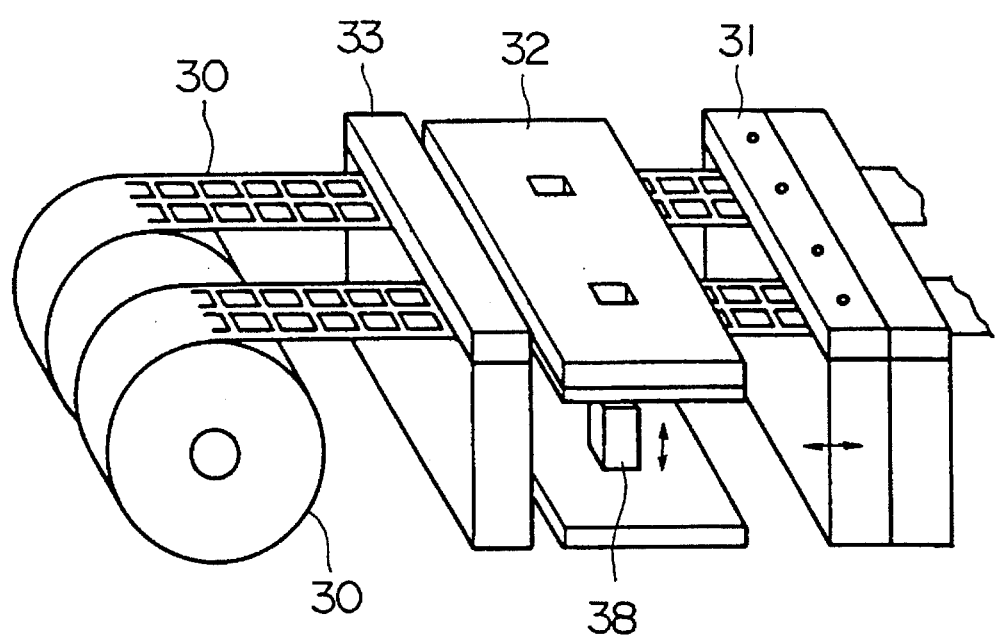
FIG. 4 is a perspective view showing a cover sheet assembling apparatus according to a first embodiment of the present invention.

FIG. 4 shows a cover sheet assembling apparatus 21 according to an embodiment of the present invention. This apparatus 21 is adapted to assemble a ladder-type filter which is similar to that shown in FIGS. 1 and 2.

As hereinafter described, a case 1 storing inner parts, i.e., resonators 2 to 5, terminal plates 6 to 9 and a plate spring 10, is chucked by a chucking unit 20 (FIG. 7A), and carried to the assembling apparatus 21. The apparatus 21 comprises a pair of paper tapes 30 which are wound in the form of rolls, a feeder 31 for feeding the tapes 30 in a stepwise manner, and a punching unit 32 for punching the tapes 30 into the cover sheets 11 and inserting each of the cover sheets 11 in the case 1, and a brake 33. The brake 33, arranged in front of the punching unit 32, prevents the tapes 30 from loosening.

Figure 5:
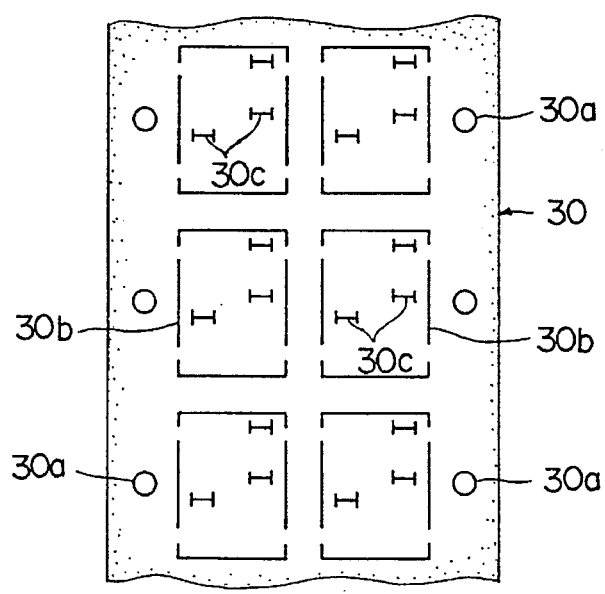
FIG. 5 is a plan view showing a paper tape.

As shown in FIG. 5, each tape 30 is provided on both sides with pin holes 30a at regular intervals for being engaged with the feeder 31 so that the tape 30 is stepwisely fed at a constant pitch. The tape 30 is further provided with perforations 30b corresponding to the contour of the cover sheet 11 at similar intervals to the the pin hole 30a so as to facilitate punching of the tapes 30. Triplets of slits 30c are formed inside the perforations 30b for receiving the lead portions 6b, 7c and 8c of the terminals 6–8.

According to this embodiment, the perforations 30b are provided in two lines in the longitudinal direction of the paper tape 30 for simultaneously inserting the cover sheets 11 in two cases 1. However the perforations 30b may alternatively be provided in a single line or three or more lines, as a matter of course.

Figure 6:
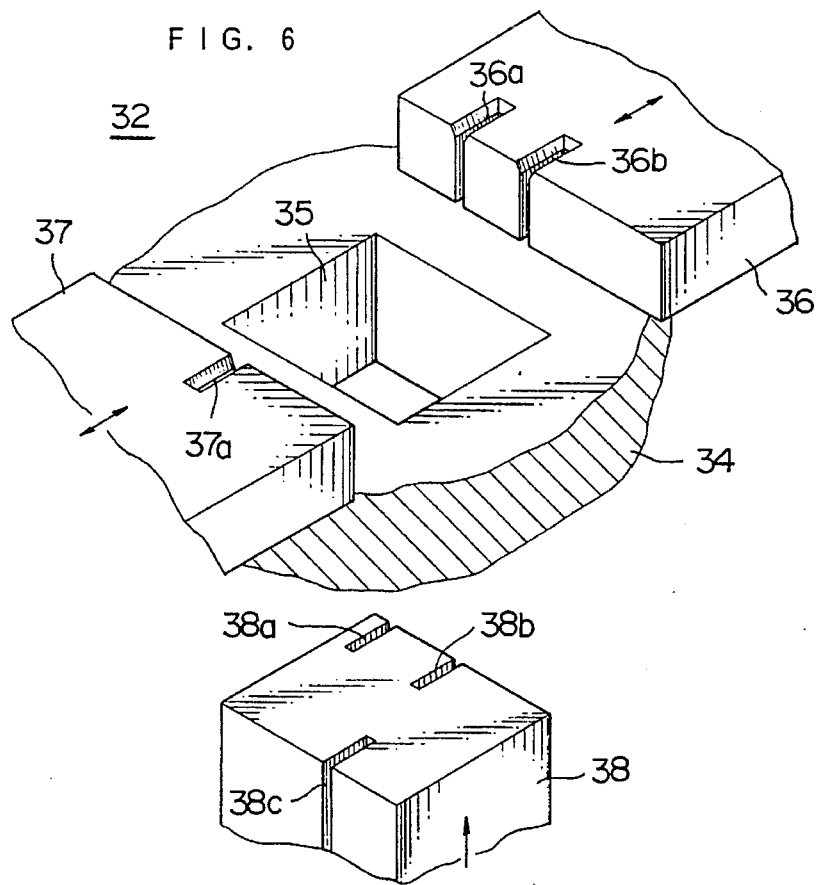
FIG. 6 is a perspective view showing a principal part of the punching unit shown in FIG. 4.

As shown in FIG. 6, the punching unit 32 comprises a die 34 having a die hole 35 whose outline corresponds to the perforations 30b, a pair of guide plates 36 and 37 which are horizontally slidable along the upper side of the die 34, and a punch 38 which can be inserted in the die hole 35. Each tape 30 is supplied along the lower side of the die 34. The thicknesses of the guide plates 36 and 37 are smaller than lengths of the lead portions 6b, 7c and 8c protruding from the case 1. The guide plates 36 and 37 are provided at the forward ends thereof with a plurality of guide grooves 36a, 36b and 37a for supporting the lead portions 6b, 7c and 8c of the terminals 6–8, thereby preventing the lead portions 6b, 7c and 8c from bending when they are inserted in the slits 30c. The punch 38 is also provided with a plurality of receiving grooves 38a–38c for receiving the lead portions 6b, 7c and 8c on both side surfaces thereof in a vertical direction.

The operation of the punching unit 32 is now described with reference to FIGS. 7A–7C.

Figure 7A:
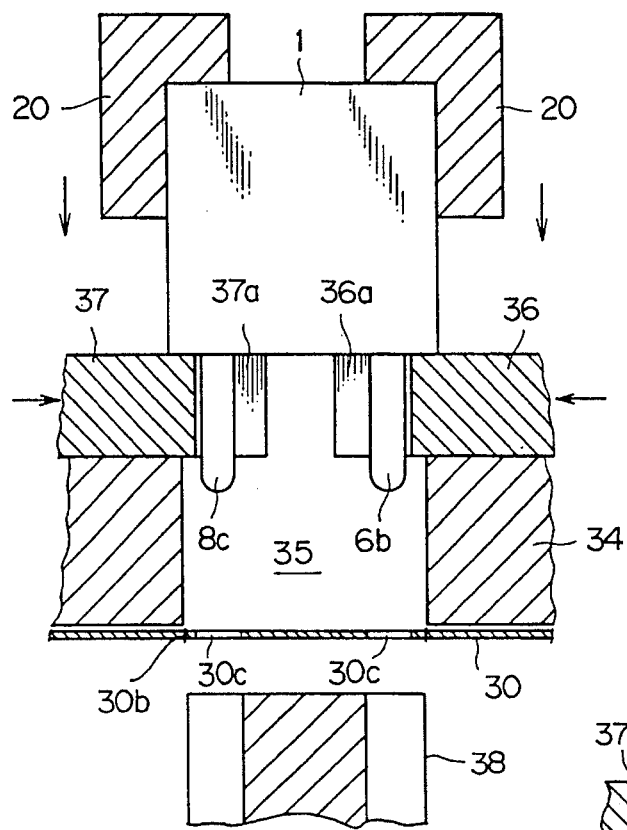
FIG. 7A, 7B and 7C are sectional views showing an operation of the punching unit shown in FIG. 6.

As shown in FIG. 7A, the guide plates 36 and 37 are inwardly moved so that the grooves 36a, 36b and 37a thereof come to positions corresponding to the die hole 35. Then, the chucking unit 20 chucking the case 1 is downwardly moved to insert the lead portions 6b, 7c and 8c in the grooves 36a, 36b and 37a respectively such that a lower surface of the case 1 is brought into contact with upper surfaces of the guide plates 36 and 37. The case 1 is held in this position by the the chucking unit 20.

Figure 7B:
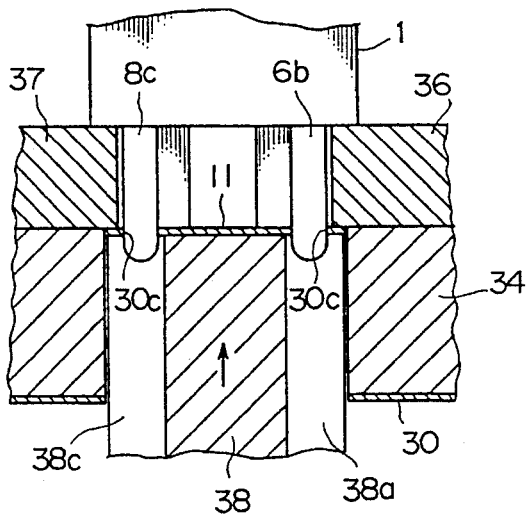
Figure 7C:
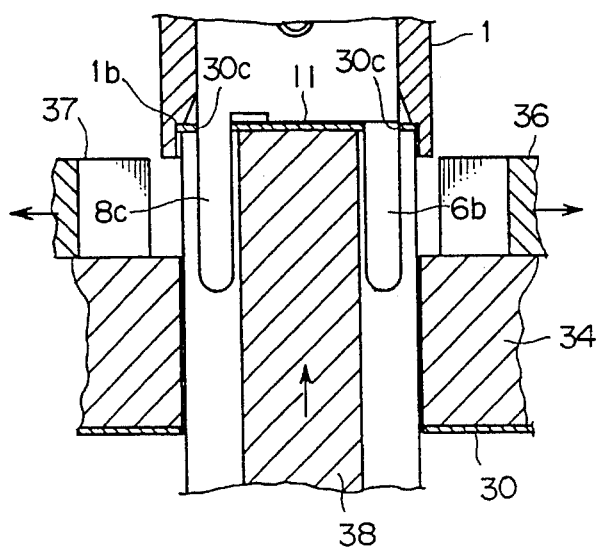

Then, as shown in FIG. 7B, the punch 38 is upwardly moved to punch the tape 30 along the perforations 30b to obtain the cover sheet 11, and the cover sheet 11 is held between the lower surfaces of the guide plates 36 and 37 and the upper surface of the punch 38. At this time, forward ends of the lead portions 6b, 7c and 8c are inserted in the grooves 38a to 38c of the punch 38 so as to pass through the slits 30c of the cover sheet 11.

Then, the guide plates 36 and 37 are outwardly moved so that the grooves 36a, 36b and 37a release the lead portions 6b, 7c and 8c. Thereafter, the punch 38 is further upwardly moved as shown in FIG. 7C. Thus, the cover sheet 11 is upwardly slid along the lead portions 6b, 7c and 8c so as to be inserted in the opening of the case 1. The cover sheet 11 is assembled in the case i when an outer peripheral edge of the sheet 11 is stopped at a step portion 1b provided in the opening of the case 1.

After the cover sheet 11 is assembled in the case 1 in the aforementioned manner, the assembled product is carried to a next sealing step, where the opening of the case 1 is filled up with filler 12 to obtain a final product.

FIGS. 8A–8D show the second embodiment of the punching unit according to the present invention.

Figure 8A:
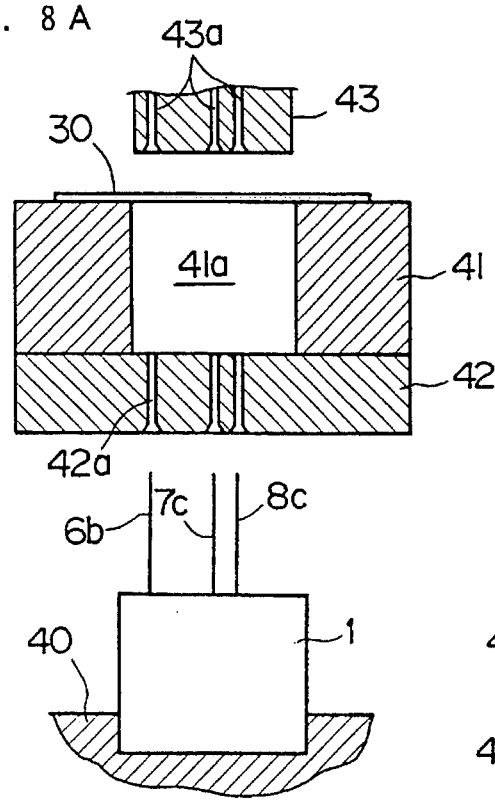
FIG. 8A–8D are sectional views showing an operation of a punching unit according to a second embodiment of the present invention.

As shown in FIG. 8A, the case 1 is set on a support member 40 so that the lead portions 6b, 7c and 8c are upwardly projected from the case 1. A die 41, a guide plate 42 and a punch 43, which are integrally movable in a vertical direction, are arranged over this support member 40. The support member 40 may be able to move horizontally in a stepwise manner. A tape 30 is fed along an upper surface of the die 41. The guide plate 42, having guide grooves 42a for supporting the lead portions 6b, 7c and 8c, is slidable along a lower surface of the die 41 in a direction parallel to the major surfaces of these lead portions.

Figure 8B:
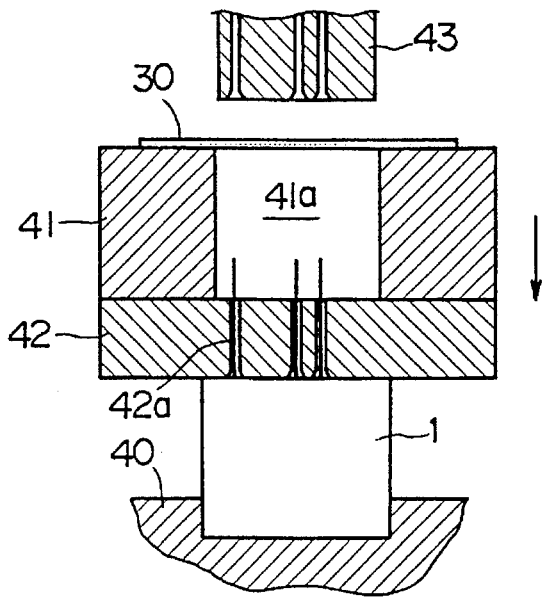

First, as shown in FIG. 8B, the die 41, the guide plate 42 and the punch 43 are downwardly moved so that a lower surface of the guide plate 42 is brought into contact with an upper surface of the case 1. At this time, the lead portions 6b, 7c and 8c are inserted into the grooves 42a.

Figure 8C:
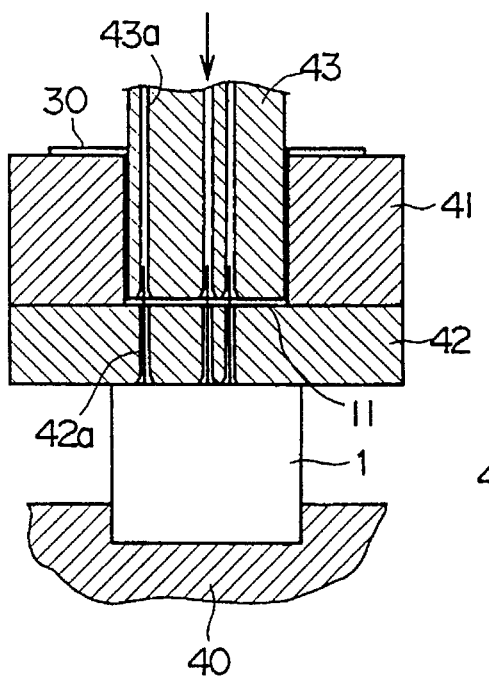

Next, as shown in FIG. 8C, the punch 43 is downwardly moved to be inserted into a die hole 41a of the die 41, thereby the cover sheet 11 is punched out from the tape 30 and held between a lower surface of the punch 43 and an upper surface of the guide plate 42. At this time, forward ends of the lead portions 6b, 7c and 8c are inserted in the grooves 43a of the punch 43 so as to pass through the slits (not shown) of the cover sheet 11.

Figure 8D:
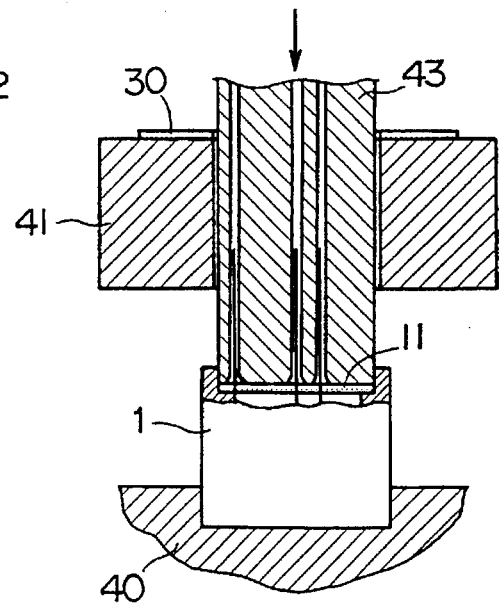

Then, as shown in FIG. 8D, the guide plate 42 is moved back so that the grooves 42a release the lead portions 6b, 7c and 8c. Thereafter, the punch 43 is further downwardly moved so that the cover sheet 11 is inserted into the opening of the case 1.

In this second embodiment, when the support member 40 supporting a plurality of the cases 1 is driven stepwisely in a horizontal direction, the cover sheets 11 can be assembled in the cases 1 successively, thereby the assembling efficiency is highly improved.

The present invention is not restricted to the aforementioned embodiments, but various modifications are available, as a matter of course.

For example, after the cover sheet is punched out from the paper tape and held between the lower surfaces of the guide plates and the upper surface of the punch, the case 1 may be downwardly moved so that the forward ends of the lead portions of the terminals are inserted in the slits of the cover sheet. Thereafter, the guide plates may be outwardly moved so that the punch is upwardly moved to insert the cover sheet into the case.

Further, the total thickness of the guide plates and the die may be made smaller than the length of the lead portion protruding from the case. In this occasion, first the case is downwardly moved so that the forward ends of the lead portions are inserted in the slits of the tape. Thereafter the guide plates are outwardly moved and the punch is upwardly moved to simultaneously punch the tape and to insert the cover sheet in the case.

Furthermore, the plate spring can be replaced by a rubber plate as a cushion member. Also, the cushion member can be eliminated if at least one of the terminal plates is made of a bent spring plate.

The present invention is not restricted to a ladder-type filter but is also applicable to another electronic component, so far as a cover sheet is inserted in the opening of the case and the opening is sealed with filler.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cover sheet assembling apparatus for assembling a cover sheet in an electronic component comprising a case having an opening, terminal plates and an element being stored in said case, said terminal plates having lead portions protruding from said opening of said case, said apparatus comprising:

a die having a front major surface, a rear major surface and a die hole, said die hole passing through said die from said front major surface to said rear major surface and corresponding to a shape of said cover sheet;

holding means for holding said case at a side of said front major surface of said die so that said lead portions of said terminal plates extend into said die hole;

feed means for feeding a sheet member having slits for receiving said lead portions of said terminal plates along said rear surface of said die; and a punch for punching out said cover sheet from said sheet member in association with said die hole, said punch being able to be inserted in said die hole and in said opening of said case; wherein said punch is drivable to punch out said cover sheet from said sheet member, and to insert said cover sheet in said opening of said case so that said slits are passed through by said lead portions of said terminal plates.

2. A cover sheet assembling apparatus in accordance with claim 1, wherein said cover sheet is inserted by said punch into said opening of said case to a certain depth, for defining a cavity to be filled up with filler.

3. A cover sheet assembling apparatus in accordance with claim 1, wherein said punch is provided with receiving grooves corresponding to said slits for receiving said lead portions of said terminal plates.

4. A cover sheet assembling apparatus in accordance with claim 1, said apparatus further comprising:

a guide plate being movable along said front surface of said die; wherein said guide plate has a smaller thickness than the lengths of said lead portions of said terminal plates protruding from said case, and has guide grooves for supporting said lead portions of said terminal plates.

5. A cover sheet assembling apparatus in accordance with claim 4, wherein said guide plate is movable in a first direction so that said guide grooves support said lead portions of said terminal plates before said cover sheet is punched out from said sheet member, and movable in a second direction so that said guide grooves release said lead portions after said cover sheet is punched out from said sheet member and forward ends of said lead portions are inserted in said slits.

6. A cover sheet assembling apparatus in accordance with claim 1, wherein said sheet member is provided with perforations corresponding to the contour of said cover sheet.

7. A cover sheet assembling apparatus in accordance with claim 6, wherein said sheet member is provided in a form of a continuous tape, and wherein pin holes are provided at a constant pitch in a longitudinal direction of said sheet member.

8. A cover sheet assembly apparatus in accordance with claim 5, wherein said first and second directions are both transverse to a movement direction of said punch.

9. A cover sheet assembly apparatus in accordance with claim 5, wherein one of said first and second directions is transverse to a movement direction of said punch.

10. A cover sheet assembly apparatus in accordance with claim 9, wherein the other of said first and second directions is the same as said movement direction of said punch.

11. A cover sheet assembly apparatus in accordance with claim 1, wherein said holding means comprises a movable chuck and said die remains stationary during movement of said chuck.

12. A cover sheet assembly apparatus in accordance with claim 1, wherein said holding means comprises a support member and said die is movable with respect to said support member.

13. A cover sheet assembly apparatus in accordance with claim 12, wherein said support member is movable transversely to a movement direction of said die.

* * * * *